United States Patent [19]

Kondo

[11] 4,311,265

[45] Jan. 19, 1982

[54] SOLDERING OF PRINTED CIRCUIT BOARDS

[76] Inventor: Kenshi Kondo, c/o Nihon Dennetsu Keiki Kabushiki Kaisha, No. 27-1, Shimomaruko 2-chome, Ohta-ku, Tokyo, Japan

[21] Appl. No.: 104,721

[22] Filed: Dec. 18, 1979

[30] Foreign Application Priority Data

Jan. 9, 1979 [JP] Japan .................................. 54/415

[51] Int. Cl.³ .............................................. H05K 3/34
[52] U.S. Cl. .................................... 228/40; 198/342; 228/43; 228/259
[58] Field of Search ............... 228/179, 180 R, 180 A, 228/185, 256, 259, 260, 36, 37, 40, 43, 47, 49 R; 198/342; 134/49, 83, 125, 165

[56] References Cited

U.S. PATENT DOCUMENTS 3,000,342  9/1961  Dorosz et al. ........................ 228/40
3,828,419  8/1974  Wanner .............................. 228/40 X

FOREIGN PATENT DOCUMENTS

52-5417  2/1977  Japan ................................ 228/36

Primary Examiner—Mark Rosenbaum
Assistant Examiner—K. J. Ramsey
Attorney, Agent, or Firm—Stephen F. K. Yee

[57] ABSTRACT

Carriers each holding a printed circuit board are conveyed successively through a soldering zone to dip each printed circuit board into molten solder contained in a vessel. The vessel is disposed between a pair of laterally spaced apart track members which are engageable with two front and two rear wheels of the carrier to support the carrier and the printed circuit board generally in the horizontal state throughout the movement thereof along the track members. Each track member has a first and a second depression at such locations that the two front and the two rear wheels can simultaneously be positioned in the first and second depressions, respectively. Each depression has a depth sufficient to permit the printed circuit board to be dipped into the molten solder when the four wheels travel therealong.

12 Claims, 17 Drawing Figures

SOLDERING OF PRINTED CIRCUIT BOARDS

BACKGROUND OF THE INVENTION

This invention relates generally to a method and an apparatus for automatically applying solder to a printed circuit board having electrical parts mounted thereon, and more particularly to a method and an apparatus for transferring such printed circuit board for contact with molten solder in a container.

Figure 1:
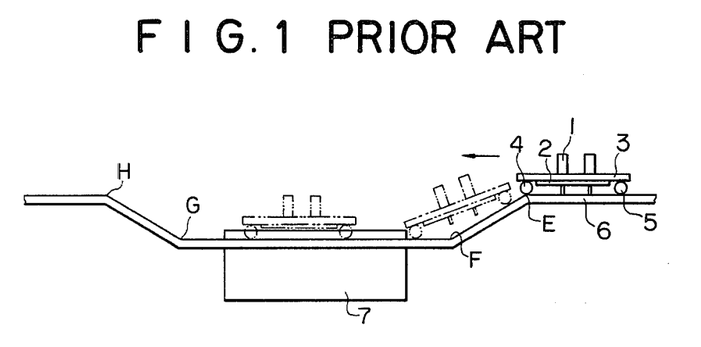
FIG. 1 is a side elevational view diagrammatically showing a conventional apparatus for soldering printed circuit boards.

FIG. 1 of the accompanying drawings shows one of known transfer apparatus of this sort, in which a printed circuit board 2 with electrical parts 1 is detachably mounted on a carrier 3 which has its front and rear wheels 4 and 5 on a rail 6. The carrier 3 is driven by a conveyor chain, which is not shown, to run on and along the rail 6. The rail 6 is provided with a sunken portion, at which the lower side of the printed circuit board 2 is dipped in molten solder in a vessel 7 to solder the electrical parts 1 thereto while the carrier 3 travels from point F to G.

In this apparatus, in order to guide the printed circuit board 2 into the solder vessel, it is necessary to introduce the fore end of the printed circuit board 2 into the solder vessel while its rear portions are still going down the slope EF. Therefore, the sunken portion EH must have a large distance with a long slope of an easy grade between the points E and F and G and H. In addition, the solder vessel 7 is required to have a large length in the direction of travel of the carrier. As a result, there arise problems such as the increased size of the apparatus as a whole, the needs for a larger amount of molten solder and for a greater amount of heat for maintaining the solder in molten state.

BRIEF SUMMARY OF THE INVENTION

It is therefore an object of the present invention to provide an apparatus for soldering a printed circuit board, which will overcome the above-mentioned problems.

It is another object of the present invention to provide an apparatus for bringing a printed circuit board into contact with molten solder in a solder bath, guiding the printed circuit board on a carrier through a shortened path of travel.

It is still another object of the present invention to provide an apparatus capable of soldering a printed circuit board with use of a small solder vessel.

BRIEF DESCRIPTION OF THE DRAWINGS

The above and other objects, features and advantages of the present invention will become apparent from the detailed description of the invention, which follows, when considered in light of the accompanying drawings, in which.

DETAILED DESCRIPTION OF THE INVENTION

Figure 2:
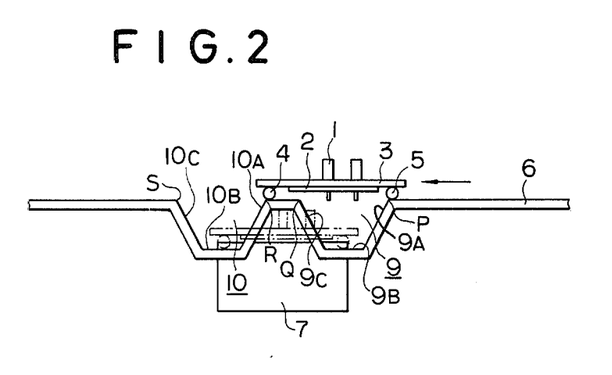
FIG. 2 is a side elevational view explanatory of operating principles of the soldering apparatus according to the present invention.

Referring first to FIG. 2 which shows the principles on which the apparatus of the invention operates, the reference numerals 1 to 7 indicate the same component parts as indicated by similar reference numerals in FIG. 1 except that the rail 6 is provided with two recesses or depressions 9 and 10 one between points P and Q and the other between points R and S. The depressions 9 and 10 are constituted respectively by descending portions 9A and 10A, flat portions 9B and 10B, and ascending portions 9C and 10C. As the carrier 3 is driven to travel on the rail 6 in the direction shown by the arrow, it can reach, by the action of a means described hereinafter, the position indicated by solid line in a horizontal state, with its front wheel 4 at the point R and its rear wheel 5 at the point P (the movement of the front wheels from the point P to the point Q will be hereinafter referred to as "carrier movement through a pre-dipping section"). If the carrier is further advanced in that state, the front and rear wheels 4 and 5 run down the descending portions 9A and 10A onto the flat portions 9B and 10B, respectively, lowering the printed circuit board 2 in horizontal state. At this location (shown by two dotted line), the printed circuit board is brought to the lowest point to have the terminations or lead wires of the electrical parts 1 and the printed circuit on its lower side dipped in the solder in a vessel 7. The carrier 3 is driven continually (or after a pause) by the conveyor chain to advance horizontally along the flat portions 9B and 10B and then upwardly along the ascending portions 9C and 10C. During this ascending movement, the printed circuit board 2 is maintained in horizontal state (the movement of the front wheel 4 from point R to point S or of the rear wheel 5 from point P to point Q will be hereinafter referred to as "movement through processing section"). As the carrier 3 is further advanced, the rear wheel 5 passes from point R to S without dropping into the depression 10, while holding the carrier in horizontal state by the function of the means which will be described hereinafter (the movement of the rear wheel 5 from point R to S will be referred to as "movement of the carrier through a post-dipping section").

The above-described arrangement requires only a short transfer passage in soldering a printed circuit board 2 which is supported on a carrier 3.

Figure 3:
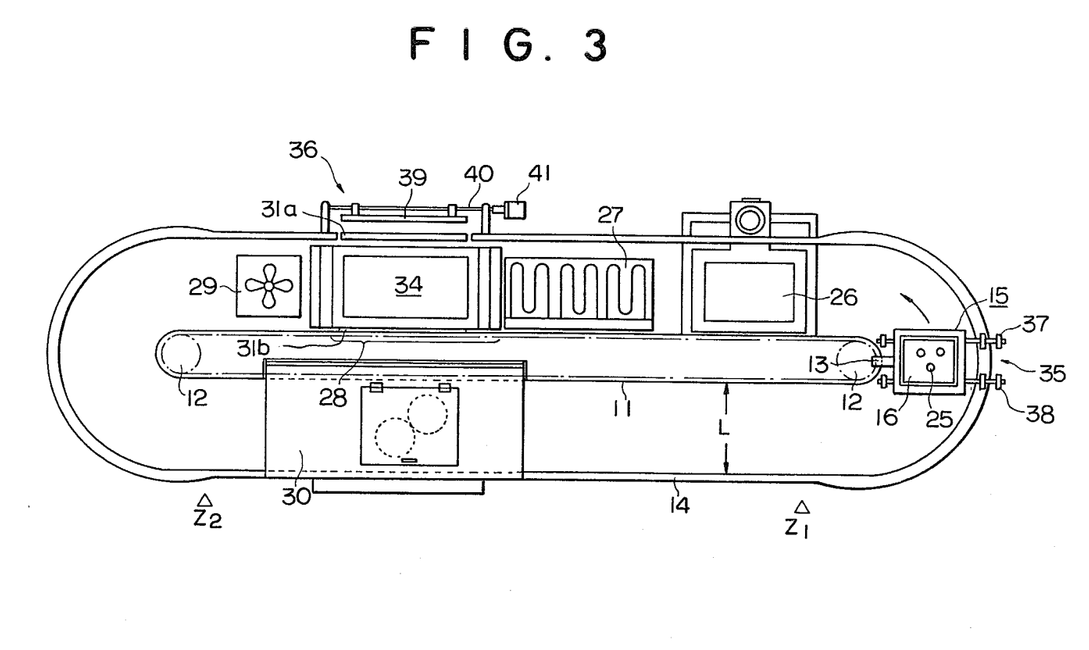
FIG. 3 is a plan view diagrammatically showing a first embodiment of the soldering apparatus according to the invention.

Referring to FIG. 3 which shows in plan view one embodiment of the soldering apparatus according to the instant invention, an endless conveyor chain indicated at 11 is placed around a pair of spacedly positioned sprocket wheels 12 which are provided on a base (not shown). One of the sprocket wheels 12 is driven to turn the conveyor chain 11 constantly therearound. Carriers which will be described hereinlater are transferred by the rotation of the conveyor chain 11 which is provided with a multiplicity of pins 13 of suitable length for engagement with the carriers. Designated at 14 is a transfer rail in the form of a loop which is provided on the base at a predetermined distance L from the conveyor chain 11.

Figure 4A:
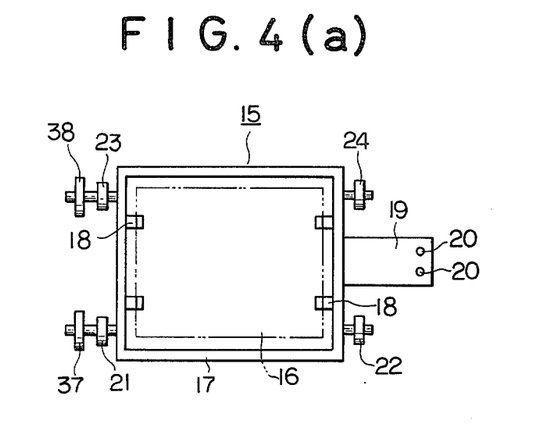
FIG. 4(a) is a plan view diagrammatically showing the carrier in FIG. 3.
Figure 4B:
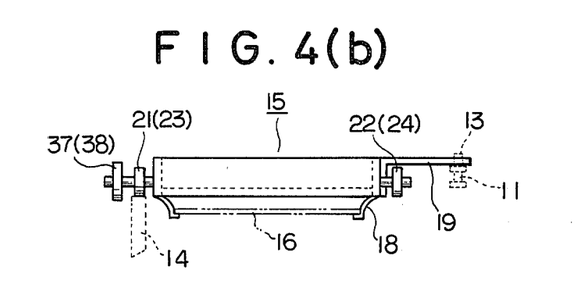
FIG. 4(b) is an elevational view of FIG. 4(a)

FIGS. 4(a) and 4(b) show, respectively, in plan and side views a carrier 15 supporting a printed circuit board 16 for movement therewith along the transfer rail 14. The carrier 15 includes a frame 17 which is provided with inwardly biased springs 18 at lower opposite sides thereby to hold the printed circuit board 16. The frame 17 has at one side a holder strip 19 with perforations 20 adapted to engage pins 13 on the conveyor chain 11. At the opposite side away from the locking strip 19, the frame 17 is provided with first front and rear wheels 21 and 23 which are preferably located in two symmetrical positions relative to the center line of the carrier to support the carrier 15 on the rail 14.

Referring to FIG. 3 again, a printed circuit board 16 with electrical parts 25 to be soldered is mounted on the carrier 15 at the position $Z_1$. The printed circuit board 16 on the carrier 15 is conveyed along a predetermined looped transfer path by the conveyor chain 11.

A number of processing zones are located in the transfer path. The carrier 15 which has started from the point $Z_1$ is passed through a flow-dip fluxer zone 26 to apply flux to the printed circuit board 16 and then through a preheating zone 27 to heat the printed circuit board 16 before sending same to a soldering zone 28 which includes a solder vessel 34. Thereafter, the carrier 15 is sent to a cooling zone 29 where the printed circuit board 16 is cooled, for example, by a fan and then to a cutter section 30 to cut off the lead wires depending from the printed circuit board 16. The printed circuit board 16 is transferred again through the fluxer zone 26 and preheating zone 27 to the soldering zone 28 to give a finish to the soldering. After being passed through the cooling zone 29, the printed circuit board 16 is removed from the carrier 15 at the position $Z_2$. Although only one carrier 15 is referred to in the foregoing description, it is to be understood that a number of carriers with the printed circuit boards are fixed at suitable intervals on the conveyor chain 13 by pins 13 to process the printed circuit boards successively.

Figure 5:
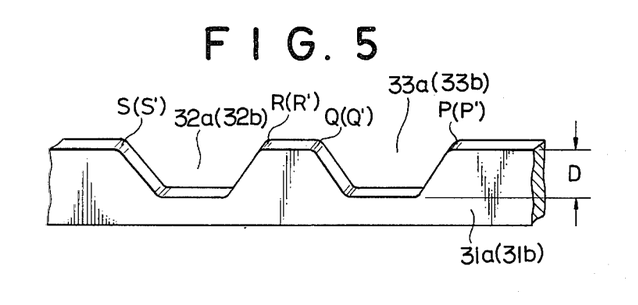
FIG. 5 is a perspective view showing the auxiliary rail of FIG. 3.

The present invention provides an improvement in such printed circuit board processing apparatus. Referring to FIG. 3, the transfer rail 14 is disconnected at the soldering zone 28 and instead provided with an auxiliary rail (or a first track member) 31a. As shown particularly in FIG. 5, the auxiliary rail 31a has a first depression 32a between the points R and S and a second depression 33a between the points P and Q which perform the same functions as the depressions 10 and 9, respectively, of FIG. 2. On the other side of the solder vessel 34 opposite to the auxiliary rail 31a, there is provided a similar auxiliary rail (or a second track member) 31b which has a first depression between points R' and S' and a second depression 33b between points P' and Q'. As seen in FIG. 4(a), second front and rear wheels 22 and 24 are provided on the side of the holder strip preferably opposite the first front and rear wheels 21 and 23. The second front and rear wheels 22 and 24 run on and along the auxiliary rail 31b in the soldering zone 28.

When the carrier 15 moves through the soldering zone, if the front wheels 21 and 22 do not drop into the depressions 33a and 33b of the auxiliary rails 31a and 31b, it can pass through the pre-dipping section in horizontal state. As the carrier 15 moves through the processing section, it is lowered in horizontal state by a distance corresponding to the depth D of the first and second depressions and then raised to the initial level. When the carrier 15 is lowered by the distance D, the underside of the printed circuit board 16 on the carrier is contacted with molten solder in the solder vessel 34 which is placed between the auxiliary rails 31a and 31b. The conveyor chain 11 is lowered in the soldering zone 28 so that the carrier 15 is engaged and supported solely by the auxiliary rails 31a and 31b at least during its descending and ascending movement, that is to say, at least during the movement through the processing section. Moreover, if the carrier 15 is further advanced without dropping its paired rear wheels 23 and 24 in the first depressions 32a and 32b, it can pass through the post-dipping section in horizontal state.

In order to pass the carrier 15 in horizontal state through the pre- and post-dipping sections, it is further provided with a guide wheel means (or a third wheel means) 35 which runs on a guide rail means (or a third track means) 36. In the embodiment shown in FIGS. 3 and 4(a), the guide wheel means 35 includes front and rear guide wheels 37 and 38 which are provided on the axles of the front and rear wheels 21 and 22, respectively. On the other hand, the guide rail means 36 includes a movable rail 39.

Figure 6:
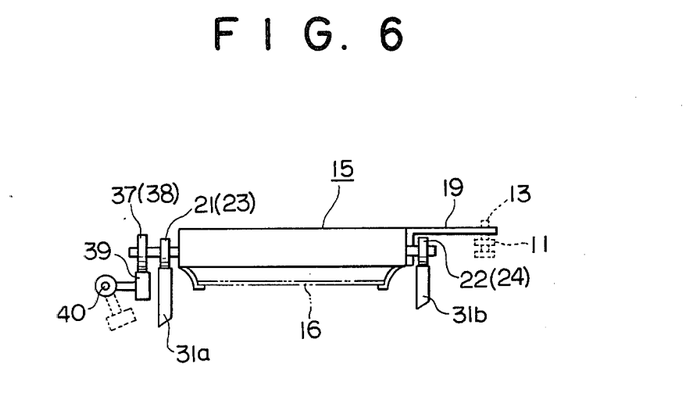
FIG. 6 is an elevational view explanatory of the function of the movable rail in FIG. 3.

As shown in FIG. 3, the movable rail 39 is fixedly mounted on a shaft 40 which is rotatingly driven by a motor 41. Therefore, the movable rail 39 is rockable between the positions indicated by solid and broken lines in FIG. 6. The rocking movement of the rail 39 is effected in a predetermined timing. More particularly, the movable rail 39 is retained in the service position indicated by solid line in FIG. 6 when the carrier 15 is moving through the pre-dipping section. As a result, the front wheels 21 and 22 are prevented from dropping into the depressions 33a and 33b. When the carrier 15 is further advanced and at least while it is passing through the processing section, the movable rail 39 is held in the retracted position indicated by broken line in FIG. 6. As a result, the front and rear guide wheels 37 and 38 are disengaged from the movable rail and the carrier 15 is guided solely by the front and rear wheels 21 to 24 during its downward, horizontal and upward movements for processing the printed circuit board 16. At least when the carrier 15 is moving through the post-dipping section, the movable rail 39 is rocked again into the service position to engage the rear guide wheel 38. Therefore, the carrier 15 is maintained in horizontal state during movement through the post-dipping section. The mechanism for rocking the movable rail 39 between the service and retracted positions in relation to the position of the carrier 15 is known in the art.

Figure 7:
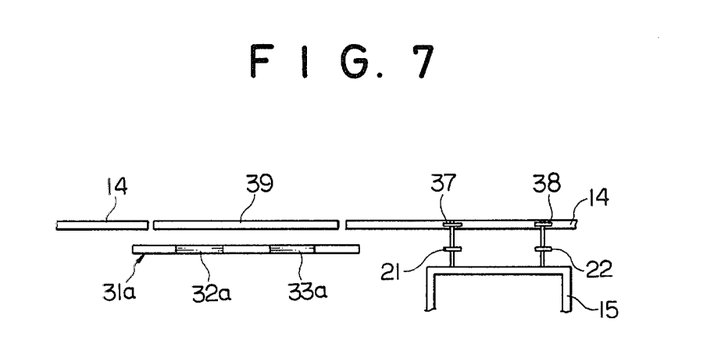
FIG. 7 is a plan view diagrammatically showing a modification of the embodiment of FIG. 3.

In the foregoing embodiment, the front and rear wheels 21 and 23 of the carrier 15 are arranged to run on the transfer and auxiliary rails 14 and 31a, with the front and rear guide wheels 37 and 38 guided by the movable rail 39. However, as illustrated in FIG. 7 arrangements may be made such that the wheels 21 and 23 run on the auxiliary rail 31a alone, using the transfer and movable rails 14 and 39 for the guide wheels 37 and 38.

Figure 8:
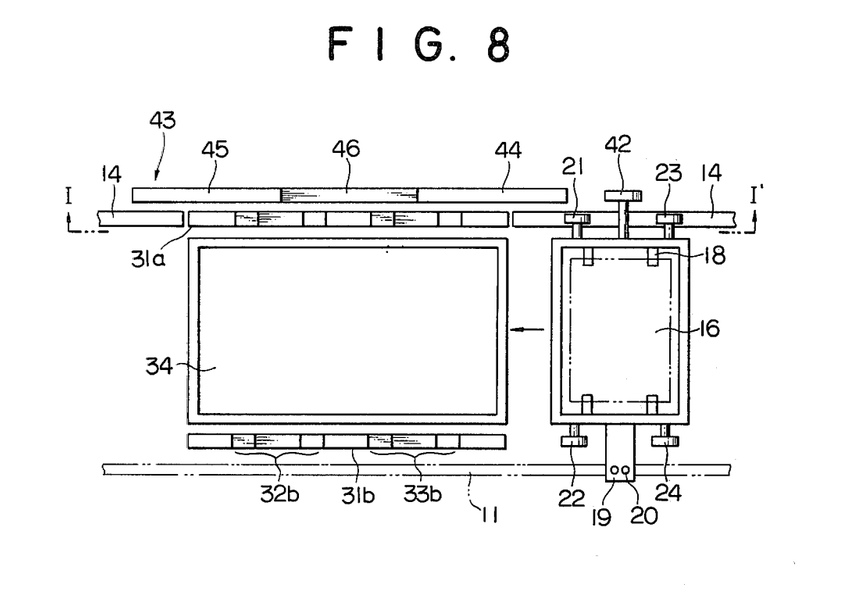
FIG. 8 is a plan view diagrammatically showing another embodiment of the invention.
Figure 9:
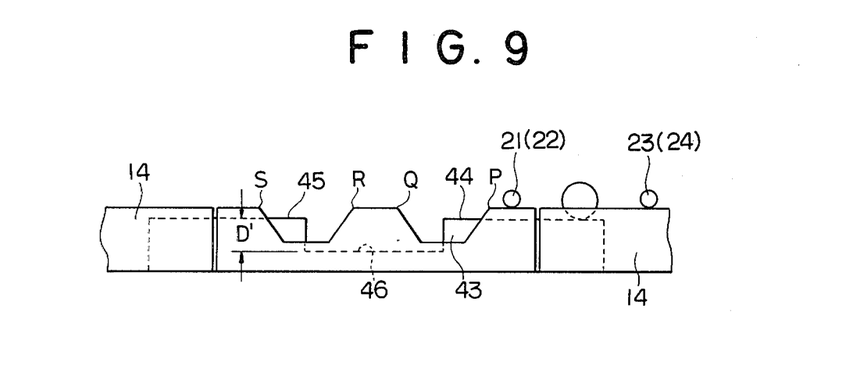
FIG. 9 is an elevational sectional view taken on line I—I' of FIG. 8.

FIGS. 8 and 9 show, in diagrammatic plan and side views, an embodiment employing the guide wheel means 35 and the guide rail means 36 of different forms. In this embodiment, the guide wheel means 35 is in the form of an intermediate wheel 42 which is mounted between the front and rear wheels 21 and 23, while the guide rail means 36 is in the form of a stationary guide rail 43 which is provided adjacent to the auxiliary rail 31a for engagement with the intermediate wheel 42. In order to support the carrier 15 in horizontal state during the movements through the pre- and post-dipping sections, the guide rail 43 is provided with a depression 46 of a depth D' between first and second guide track portions 44 and 45 which have a sufficient length for engagement with the intermediate wheel 42.

Thus, as the carrier 15 moves through the pre-dipping section, it is supported by the intermediate wheel 42, rear wheels 23 and 24, and holder strip 19 without allowing the front wheels 21 and 22 to drop into the depressions 33a and 33b. Similarly, the rear wheels 23 and 24 do not drop into the depressions 32a and 32b, respectively. During the movement of the carrier 15 through the processing section, the intermediate wheel 42 runs over the depression 46 of the guide rail 43. However, since the depth D' of the depression 46 in the guide rail 43 is greater than the depth D of the first and second depressions, the intermediate wheel 42 is disengaged from the guide rail 43 to preclude its interference with the downward, horizontal and upward movements of the carrier 15. Of course, the depth D and D' may be the same, if desired, letting the intermediate wheel 42 engage the depression 46 when the carrier 15 passes through the processing section. In any case, the length of the depression 46 in the direction of travel of the carrier 15 should correspond to the distance of travel of the carrier 15 in the processing section. In order to prevent the axle of the intermediate wheel 42 from hitting against the auxiliary rail 31a during the movement of the carrier 15 through the processing section, the axle is shaped such as into a crank or other suitable form. It is desired to provide the intermediate wheel 42 in the vicinity of a median point between the front and rear wheels 21 and 22 for the purpose of ensuring stabilized movements of the carrier 15 through the pre- and post-dipping sections.

The guide rail 43 is provided on the outer side of the auxiliary rail 31a in the foregoing embodiment. Alternatively, it may be located on the inner side of the rail 31a, if desired, and providing the intermediate wheel 42 on the inner side of the front and rear wheels 21 and 23. It is also possible to provide another guide rail similar to the guide rail 43 on the side of the auxiliary rail 31b and another intermediate wheel on the opposite side of the intermediate wheel 42.

Figure 10:
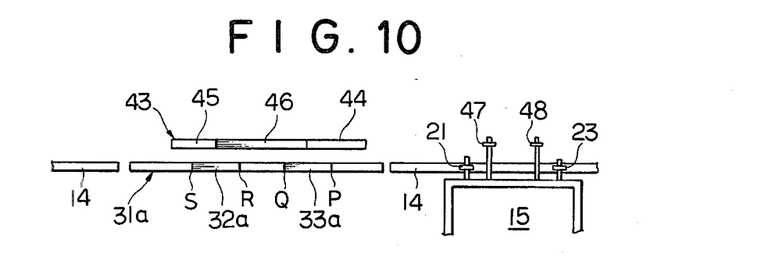
FIG. 10 is a plan view diagrammatically showing a modification of the embodiment of FIG. 8.

FIG. 10 shows a modification of the foregoing second embodiment, in which front and rear guide wheels 47 and 48 are employed in place of the intermediate wheel 42. In the modification of FIG. 10, the carrier 15 is supported on the guide rail 43 by the front guide wheel 47 during its movement through the pre-dipping section and by the rear guide wheel 48 during its movement through the post-dipping section, ensuring the travel of the carrier 15 in more stabilized state than in the foregoing second embodiment. In this instance, however, the distance between the axes of the front wheel 21 and front guide wheel 47 and that between the axes of the rear wheel 23 and rear guide wheel 48 should be smaller than half the distance between the points P and Q.

Figure 11:
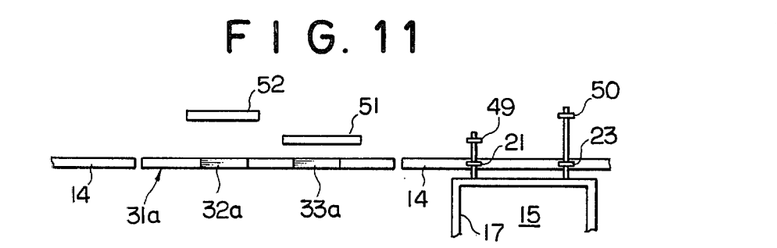
FIG. 11 is a plan view diagrammatically showing still another embodiment of the invention.
Figure 12:
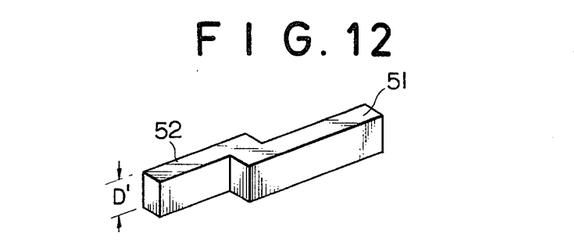
FIG. 12 is a perspective view showing an example of the guide rail in FIG. 11.

FIG. 11 shows a fourth embodiment which employs the guide wheel means 35 and the guide rail member 36 of different forms. In this embodiment, a front guide wheel 49 and a rear guide wheel 50 are mounted on the axles of the front and rear wheels 21 and 23, respectively, in place of the intermediate wheel 42 of FIG. 8, the front and rear guide wheels 49 and 50 engaging respectively with first and second guide rails 51 and 52. The just-mentioned guidr rails 51 and 52 may be connected integrally with each other as shown in FIG. 12.

Referring to FIG. 11, the first guide rail 51 has a length sufficient for supporting the front guide wheel 49 while the carrier 15 is passing through the pre-dipping section. On the other hand, the second guide rail 52 has a sufficient length for supporting the rear guide wheel 50 while the carrier 15 is passing through the post-dipping section. However, the first and second guide rails 51 and 52 are of such length which would not interfere with the downward, horizontal and upward movements of the carrier 15 which take place when passing through the processing section. Therefore, the carrier 15 can pass thorugh the pre- and post-dipping sections in horizontal state, subjecting the printed circuit board to the soldering treatment when passing through the processing section.

Figure 13:
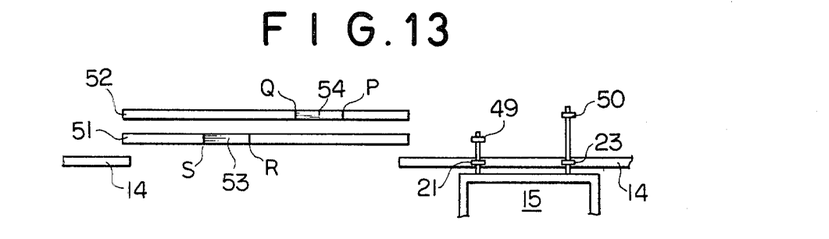
FIG. 13 is a plan view diagrammatically showing a further embodiment of the invention.

FIG. 13 shows another embodiment, a modification of the fourth embodiment of FIG. 4, in which the auxiliary rail 31a is eliminated and its function is performed by the first and second guide rails 51 and 52. More particularly, in this fifth embodiment, the front and rear wheels 21 and 23 of the carrier 15 are used for conveying the carrier 15 along the path of travel formed by the rail 14. In the soldering section, the carrier 15 is transferred by the wheels 49, 50, 22 and 24. The first rail 51 is formed with a depression 53 which corresponds to the first depression 32b on the second auxiliary rail 31b. On the other hand, the second rail 52 is formed with a depression 54 which corresponds to the second depression 33b. Therefore, while the front wheels 49 and 22 run in the first depressions 53 and 32b and the rear wheels 50 and 24 in the second depressions 54 and 33b, the carrier 15 moves downward, horizontally and then upward to let the printed circuit board undergo the soldering treatment. In this instance, it is to be noted that the axle of the rear guide wheel 50 is formed in a suitable shape to clear the first guide rail 51.

Figure 14:
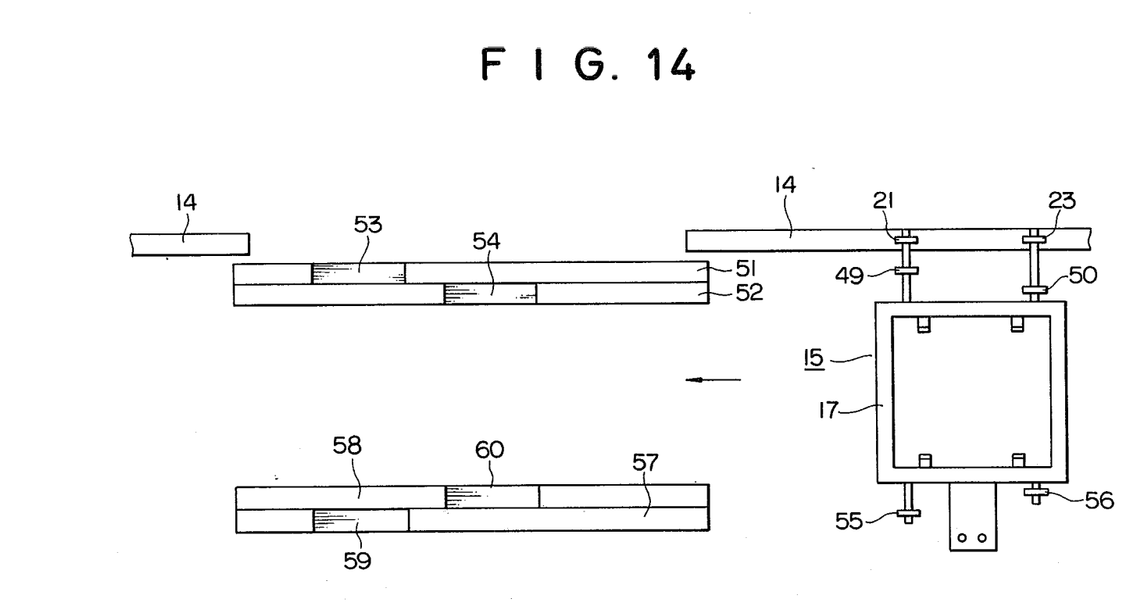
FIG. 14 is a plan view diagrammatically showing a still further embodiment of the invention.

In the all above-described embodiments, the front and rear wheels 22 and 24 on the side of the holder strip of the carrier 15 are shown as running on one common auxiliary rail 31b. However, arrangement may be made such that the wheels 22 and 24 run on separate rails one with a depression corresponding to the first depression 32b and the other with a depression corresponding to the second depression 33b. FIG. 14 shows an example which applies such rail arrangement to the fifth embodiment of FIG. 13. In FIG. 14, the reference numerals 55 and 56 designate front and rear guide wheels which correspond respectively to the front and rear wheels 22 and 24 in FIG. 13. Denoted at 57 and 58 are rails which are provided in place of the auxiliary rail 31b and at 59 and 60 are depressions which correspond to the first and second depressions 32b and 33b, respectively.

As clear from the foregoing description, the carrier can be lowered to a predetermined level through a shortened path of travel owing to the above-described operating principles. Where the printed circuit board is lowered and lifted in a horizontal state, gases are sometimes trapped between the printed circuit board 16 and the molten solder in the vessel 34, resulting in defective soldering.

Figure 15:
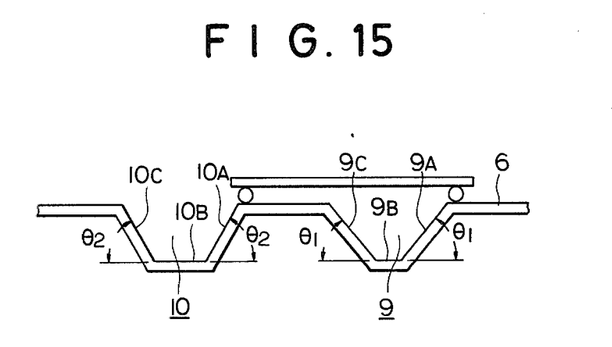
FIG. 15 is an elevational, similar to FIG. 2, diagrammatically showing an example of the auxiliary rail.
Figure 16:
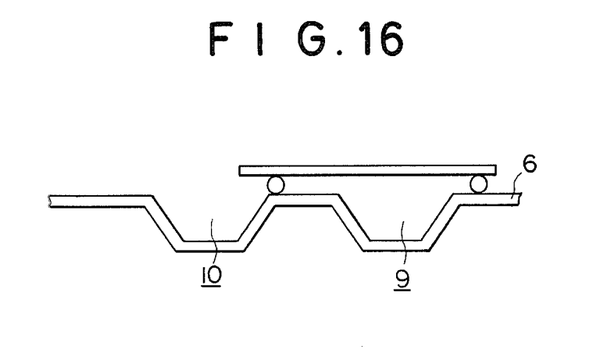
FIG. 16 is a diagrammatic view of another example of the auxiliary guide rail.

This problem can be solved by determining, as shown in FIG. 15, the angle of inclination $\theta_1$ for the descending slopes 9A and 10A and $\theta_2$ for the ascending slopes 9B and 10B of the trapezoidal depressions 9 and 10 in FIG. 2 in the relations of $\theta_2 > \theta_1$. Alternatively, the depressions may be provided in such relative positions that the front wheel of the carrier begins to descend the slope before the rear wheel as shown in FIG. 16, lowering the printed circuit board at a predetermined angle relative to the horizontal in the instant of contacting the molten solder in the vessel, and after dipping in horizontal state, lifting the printed circuit board again with a predetermined angle of inclination. This arrangement serves to permit gases to escape from the contact area between the printed circuit board and the molten solder to effect soldering of satisfactory quality. It is to be understood that the same arrangement is applicable also to the auxiliary rails 31a and 31b of FIG. 5.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. An apparatus for applying solder to printed circuit boards, comprising:
    a carrier adapted to support a printed circuit board;
    first front and rear wheels mounted at one side of said carrier;
    second front and rear wheels mounted at the other side of said carrier;
    a pair of laterally spaced first and second track members, said first track member being engagable by said first front and rear wheels and said second track member being engagable by said second front and rear wheels of said carrier, whereby said carrier is able to be supported on said first and second track members by said first and second front wheels and said first and second rear wheels;
    drive means for displacing said carrier along said track members;
    a solder vessel containing molten solder and located between said first and second track members;
    first and second depressions of the same depth formed in each one of said first and second track members at predetermined positions for simultaneously receiving said first and second front wheels and said first and second rear wheels, respectively;
    each one of said first and second depressions having a length and a depth sufficient to allow the underside of said printed circuit board on said carrier to be brought into contact with the molten solder in said solder vessel when said first and second front wheels and said first and second rear wheels move along said first and second depressions, respectively; and
    third track means engageable by a third wheel means of said carrier for preventing said first and second front wheels and said first and second rear wheels from engaging said second and first depressions, respectively.

2. An apparatus as defined in claim 1, wherein said drive means is a conveyor chain which supportingly engages a part of said carrier at said other side thereof.

3. An apparatus as defined in claim 2, wherein said third wheel means comprises third front and rear wheels provided at said one side of said carrier in positions detached from said first track member and adapted to run respectively on separate tracks, and said third track means comprises a first guide rail having a length sufficient for supportingly engaging said third front wheel when said first front wheel is moving in said second depression and a second guide rail having a length sufficient for supportingly engaging said third rear wheel when said first rear wheel is moving in said first depression.

4. An apparatus as defined in claim 2, wherein said third wheel means includes an intermediate wheel provided at a median point between said first front and rear wheels and detached from said first track member, and said third track means comprises first and second guide tracks having a length sufficient for supportingly engaging said intermediate wheel when said first and second rear wheels are moving respectively in said second and first depressions, and a depression provided between said first and second guide tracks and having a depth and a length equivalent to or greater than those of said first and second depressions.

5. An apparatus as defined in claim 2, wherein said third wheel means includes front and rear guide wheels provided at said one side of said carrier, said third track means including a guidr rail movable between a service position and a retracted position, said guide rail being held in said service position for supportingly engaging said front and rear guide wheels when said first and second front wheels and said first and second rear wheels are moving respectively in said second and first depressions and being held in said retracted position when said first and second front wheels and said first and second rear wheels are moving respectively in said first and second depressions.

6. An apparatus as defined in any one of claims 1 to 5, wherein said first and second depressions on said first and second track members are so shaped as to support said carrier and the printed circuit board therein in horizontal state when said first and second front wheels and said first and second rear wheels are moving respectively in said first and second depressions.

7. An apparatus as defined in any one of claims 1 to 5, wherein said first and second depressions on said first and second track members are so shaped as to support said carrier and the printed circuit board therein in a forwardly tilted state when said printed circuit board is initially brought into contact with said molten solder and in a rearwardly tiltted state when said printed circuit board is brought out of contact with said molten solder.

8. An apparatus as defined in any one of claims 1 to 5, further comprising a transfer rail provided in series with said first track member for engagement with said first front and rear wheels.

9. An apparatus as defined in claim 3, further comprising a transfer rail provided in series with said movable guide rail in said service position and engageable with said front and rear guide wheels.

10. An apparatus for applying solder to printed circuit boards, comprising:
a carrier adapted to support a printed circuit board;
first front and rear wheels mounted at one side of said carrier;
second front and rear wheels mounted at the other side of said carrier;
a pair of laterally spaced first and second track members adapted for supporting engagement with said carrier, said first track member having first and second subtracks separately for engagement with said first front and rear wheels of said carrier, respectively, and said second track member having third and fourth subtracks separately for engagement with said second front and rear wheels of said carrier;
drive means for displacing said carrier along said first and second track members; and
a solder vessel containing molten solder and positioned between said first and second track members;
said first to fourth subtracks having depressions of the same depth which are simultaneously engageable respectively with said first and second front and rear wheels, said depressions having a length and a depth sufficient to allow the underside of said printed circuit board on said carrier to be brought into contact with said molten solder when said first and second front and rear wheels are moving in said depressions.

11. An apparatus as defined in claim 10, wherein said drive means is a conveyor chain which is adapted to supporting engagement with one part of said carrier at said one side thereof.

12. An apparatus as defined in claim 11, further comprising third front and rear wheels mounted at said one side of said carrier and a transfer rail engageable with said third front and rear wheels and having a notched portion to allow engagement of said first and second front and rear wheels with depressions on said first to fourth subtracks.

* * * * *